United States Patent
Lin

(10) Patent No.: US 10,256,179 B2
(45) Date of Patent: Apr. 9, 2019

(54) PACKAGE STRUCTURE AND MANUFACTURING METHOD THEREOF

(71) Applicant: NANYA TECHNOLOGY CORPORATION, Taoyuan (TW)

(72) Inventor: Po-Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 15/424,898

(22) Filed: Feb. 6, 2017

(65) Prior Publication Data

US 2018/0226332 A1 Aug. 9, 2018

(51) Int. Cl.
*H01L 23/498* (2006.01)
*H01L 23/00* (2006.01)
*H01L 21/56* (2006.01)
*H01L 23/31* (2006.01)

(52) U.S. Cl.
CPC ........ *H01L 23/49838* (2013.01); *H01L 21/56* (2013.01); *H01L 23/3157* (2013.01); *H01L 23/3192* (2013.01); *H01L 23/49827* (2013.01); *H01L 23/49894* (2013.01); *H01L 24/05* (2013.01); *H01L 24/11* (2013.01); *H01L 24/13* (2013.01); *H01L 2224/0401* (2013.01)

(58) Field of Classification Search
None
See application file for complete search history.

(56) References Cited

U.S. PATENT DOCUMENTS

| | | | |
|---|---|---|---|
| 5,926,694 A * | 7/1999 | Chigawa | H01L 21/563 257/E21.503 |
| 8,618,658 B1 | 12/2013 | Paek et al. | |
| 2003/0032276 A1 * | 2/2003 | Kim | H01L 23/3114 438/613 |
| 2005/0020051 A1 * | 1/2005 | Tsai | H01L 24/11 438/613 |
| 2008/0061436 A1 * | 3/2008 | Yang | H01L 23/3114 257/738 |
| 2008/0090427 A1 * | 4/2008 | Humpston | H01L 23/49811 439/66 |
| 2008/0099894 A1 * | 5/2008 | Yoshioka | G02F 1/13452 257/673 |
| 2009/0166859 A1 * | 7/2009 | Yuan | H01L 24/03 257/737 |
| 2011/0079799 A1 * | 4/2011 | Lee | C09J 9/02 257/91 |
| 2011/0291273 A1 * | 12/2011 | Huang | H01L 24/11 257/738 |
| 2012/0119355 A1 * | 5/2012 | Chung | H01L 21/76898 257/737 |
| 2013/0181347 A1 * | 7/2013 | Tsai | H01L 24/13 257/737 |
| 2017/0141060 A1 * | 5/2017 | Chen | H01L 24/11 |

FOREIGN PATENT DOCUMENTS

| | | |
|---|---|---|
| EP | 1022774 A2 | 7/2000 |
| JP | 2014-107315 A | 6/2014 |

* cited by examiner

*Primary Examiner* — Bilkis Jahan

(74) *Attorney, Agent, or Firm* — CKC & Partners Co., LLC

(57) ABSTRACT

A package structure includes an interconnection layer; a passivation layer disposed on the interconnection layer, in which the interconnection layer and the passivation layer defined at least one opening; at least one elastic bump disposed on the interconnection layer, in which a portion of the elastic bump is embedded in the opening; and a conductive layer disposed on the elastic bump.

11 Claims, 8 Drawing Sheets

PACKAGE STRUCTURE AND MANUFACTURING METHOD THEREOF

BACKGROUND

Field of Invention

The present invention relates to a package structure and a manufacturing method thereof.

Description of Related Art

With the development of package structures, low cost redistribution layers and bumping technologies have been progressively improved. A passivation layer made of polyimide (PI) provides a good buffer to bumps disposed thereon with its elasticity. However, the PI layer has low adhesive strength to its underlying and overlying layers, and the PI layer may be easily peeled off from a wafer and cause damage to its end product structure. On the other hand, since the PI layer may shrink during processing, the quality of the end product, such as pitch, may be affected accordingly.

A passivation layer made of hard material, such as $SiO_2$, may provide good forming accuracy and fine-pitch. However, this type of layer may induce high inner stress in a region under bumps and may cause damage to the overall structure accordingly. Thus, for meeting requirements for good pitch quality and high reliability, advanced package forming methods and structures are needed.

SUMMARY

An embodiment of the present disclosure is related to a package structure including an interconnection layer; a passivation layer disposed on the interconnection layer, in which the passivation layer has at least one opening; at least one elastic bump disposed on the interconnection layer, in which a portion of the elastic bump is embedded in the opening; and a conductive layer disposed on the elastic bump and the passivation layer.

Another embodiment of the present disclosure is related to a manufacturing method of a package structure. The manufacturing method includes forming an interconnection layer; forming a passivation layer on the interconnection layer; recessing the passivation layer to form at least one opening; forming a least one elastic bump in the opening, in which a portion of the elastic bump is embedded in the opening; and forming a conductive layer on the elastic bump and the passivation layer.

Another embodiment of the present disclosure is related to a manufacturing method of package structure, the manufacturing method includes forming an interconnection layer; recessing the interconnection layer to form at least one opening; forming a least one elastic bump in the opening, in which a portion of the elastic bump is embedded in the opening; and forming a conductive layer on the elastic bump.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
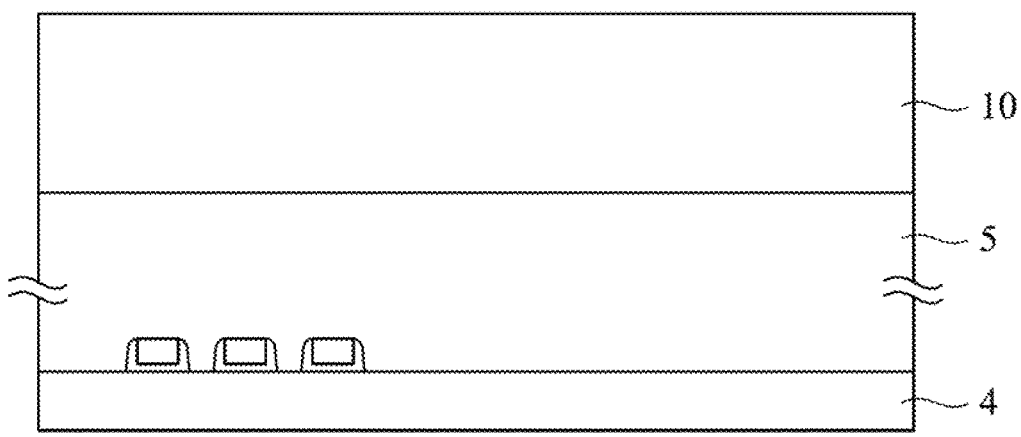
FIGS. 1A to 1G are cross-sectional views illustrating sequential processes for manufacturing a package structure according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIGS. 1A to 1G are cross-sectional views illustrating sequential processes for manufacturing a package structure according to some embodiments of the present disclosure. Although there are some structures such as transistors or other elements (e.g., contacts etc.) constituting the semiconductor device (hereinafter referred to as "underlying structures") between the substrate and the interconnection layer(s), detailed illustrations of such elements are omitted in FIGS. 1B-1G (and FIGS. 1H, 2A-2E and 3A-3E) for simplicity. It is understood that additional operations can be provided before, during, and after the processes shown by FIGS. 1A-1G (and FIGS. 2A-2E and 3A-3E), and some of the operations described below can be replaced or skipped, for additional method embodiments. The order of the operations/processes may be interchangeable.

As shown in FIG. 1A, an interconnection layer 10 is formed over underlying structures 5 disposed over a substrate 4. The underlying structures 5 may include transistors, resistors, capacitors, local wirings, isolation layers and/or device isolation layers. It is noted that the underlying structures 5 and the substrate 4 are omitted in the following figures for simplicity.

The interconnection layer 10 may be a single layer structure or a multi-layer structure. The interconnection layer 10 includes metal lines, conductive vias, and one or more interlayer dielectric layers (ILD). The metal lines and the conductive vias are designed to provide electrical connections, and the interlayer dielectric layers encapsulate the metal lines and the conductive vias. In some embodiments, the interlayer dielectric layers are formed from silicon oxide-based material, and silicon nitride based material. The silicon oxide-based material may include silicon oxide, SiON, SiOC or SiOCN, SiCOH, and the silicon nitride-based material may include silicon nitride, SiON, SiCN or SiOCN.

Figure 1B:
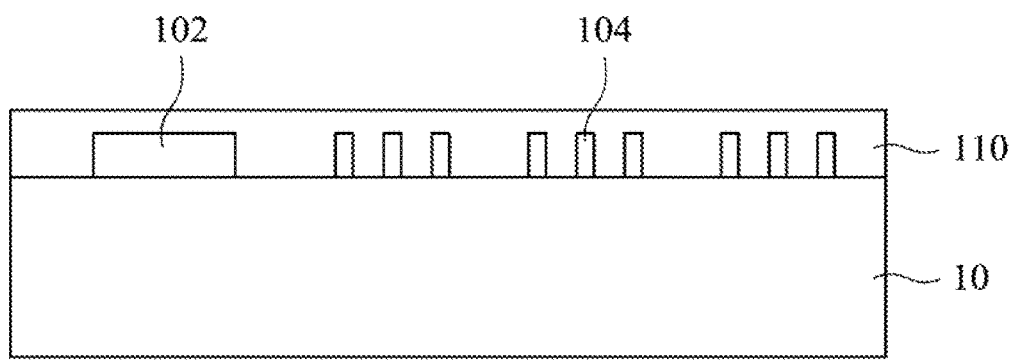

Referring to FIG. 1B, a pad 102 and coupling blocks 104 are patterned and formed on the interconnection layer 10. The pad 102 is electrically connected to the interconnection layer 10 (i.e. the metal lines and vias in the interconnection layer). In this embodiment, the coupling blocks 104 are metal lines, and may be electrically connected to the interconnection layer 10 according to design requirements. The pad 102 and the coupling blocks 104 may be formed from the same material, such as metal (i.e. Al or Cu), and may be formed at the same time. In some embodiments, the coupling blocks 104 may be formed from a material different from that forming the pad 102, such as dielectric.

Then, a first passivation layer 110 is formed over the interconnection layer 10, the pad 102, and the coupling blocks 104. In some embodiments, the first passivation layer 110 is formed from $SiO_2$, such that the structure may have high forming accuracy and fine pitch capability. In some embodiments, the first passivation layer 110 is to formed from polyimide.

Figure 1C:
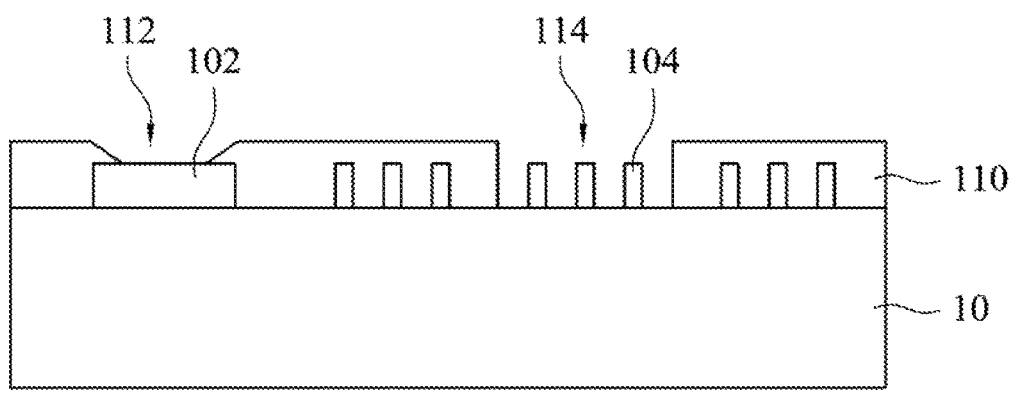

Referring to FIG. 1C, the first passivation layer 110 is recessed to form openings 112 and 114 in the first passivation layer 110. The pad 102 is exposed from the first passivation layer 110 through the opening 112. A portion of the coupling blocks 104 and a portion of a top surface of the interconnection layer 10 are exposed from the first passivation layer 110 through the opening 114. In other words, the opening 112 is defined by the first passivation layer 110, the interconnection layer 10, and the coupling blocks 104. The openings 112 and 114 may be formed by suitable methods, such as photolithography and etching. The materials of etchant, the first passivation layer 10, the pad 102, the coupling blocks 104, and/or the interconnection layer 10 are selected to provide good etching selectivity.

Figure 1D:
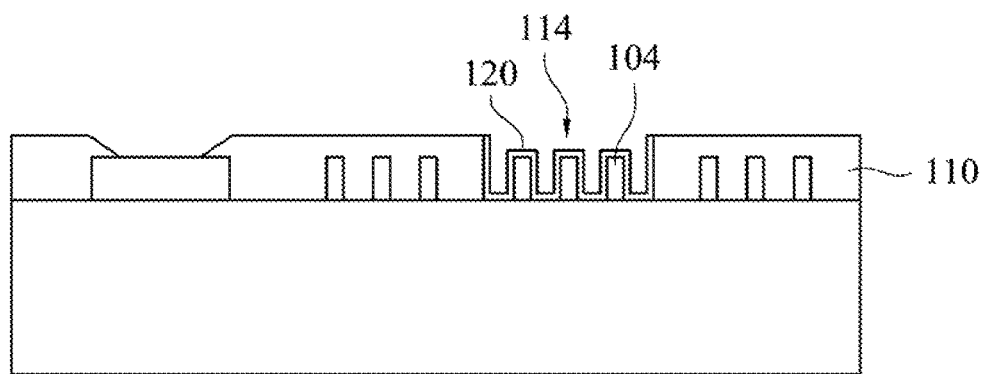

Referring to FIG. 1D, an adhesive layer 120 is formed in the opening 114. In particular, the adhesive layer 120 is conformally formed over the sidewall of the first passivation layer 110, the exposed coupling blocks 104, and the exposed surface of the interconnection layer 10. In some embodiments, the adhesive layer 120 may be resin, such as epoxy. In some other embodiments, the adhesive layer 120 may be omitted.

Figure 1E:
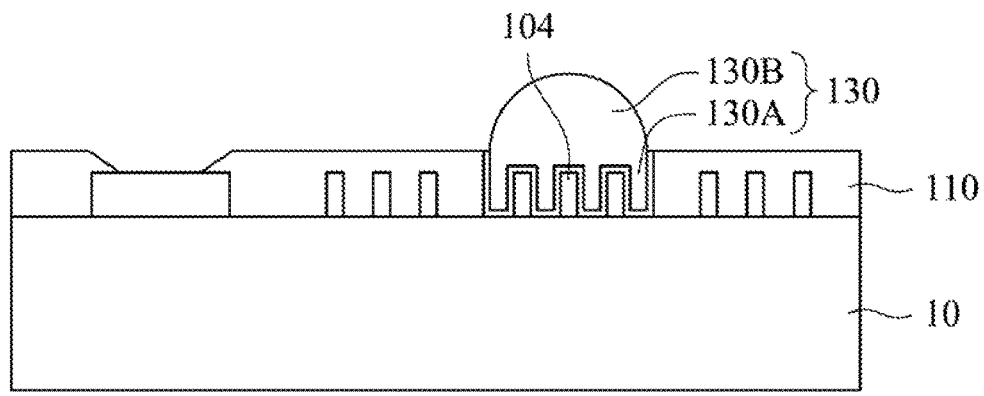

Referring to FIG. 1E, an elastic bump 130 is formed over the interconnection layer 10 and in the opening 114. The elastic bump 130 is formed from an elastic material, such as polyimide (PI), polydimethylsiloxane (PDMS), or polyurethane (PU). In detail, the elastic bump 130 includes an embedded portion 130A and a protrusive portion 130B. The protrusive portion 130B is exposed from the first passivation layer 110. The embedded portion 130A is embedded in the first passivation layer 110 and coupled with the coupling blocks 104. Because the coupling blocks 104 are engaged into the embedded portion 130A of the elastic bump 130, the contact area between the coupling blocks 104 and the elastic bump 130 is increased, such that the adhesive strength of the elastic bump 130 may be improved.

Referring back to FIG. 1B, as described above, since the coupling blocks 104 are applied for increasing the contact area between the coupling blocks 104 and the elastic bump 130, the coupling blocks 104 are not required to be electrically connected to the interconnection layer 10. In some embodiment, the coupling blocks 104 and the pad 102 may be formed from different materials at different stages. For example, the coupling blocks 104 may be hard masks formed from dielectric materials. However, in the present embodiment, the coupling blocks 104 and the pad 102 are formed from the same material (i.e. metal), such that the coupling blocks 104 may not only provide electrical connection to other elements, but also provide an enlarged contact area to the elastic bump 130.

Figure 1F:
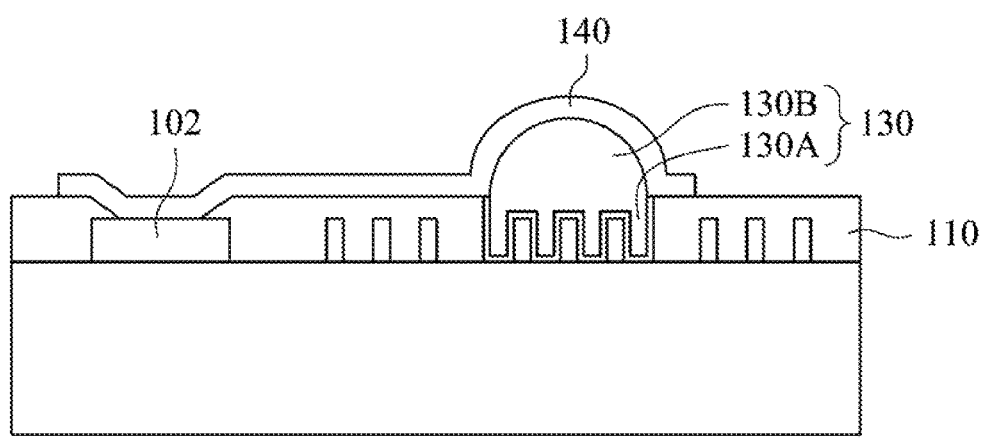

Referring to FIG. 1F, a conductive layer 140 is formed in the opening 112 and over the first passivation layer 110 and the elastic bump 130. The conductive layer 140 is directly disposed on the passivation layer 110 and the elastic bump 130, and is in contact with the pad 102. In other words, the conductive layer 140 is electrically connected to the interconnection layer 10 and the underlying structure 5 (as shown in FIG. 1A) through the pad 102. The conductive layer 140 may be formed by a suitable deposition technology, such as chemical vapor deposition (CVD), physical vapor deposition (PVD), or atomic layer deposition (ALD). Also, the conductive layer 140 may further be patterned according to design requirements.

In detail, the conductive layer 140 is formed on the surface of the protrusive portion 130B of the elastic bump 130. Thus, the elastic bump 130 and the conductive layer 140 thereon may be collectively referred to as a conductive bump, in which the conductive bump electrically connects the interconnection layer 10 to other devices.

Figure 1G:
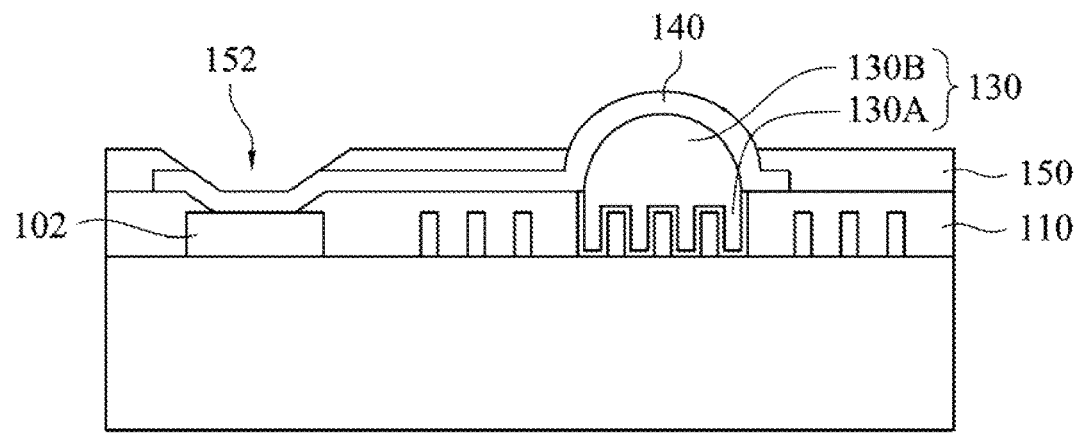

Referring to FIG. 1G, a second passivation layer 150 is formed over the conductive layer 140 and the first passivation layer 110. Then, the second passivation layer 150 is patterned. As a result, the conductive layer 140 formed on the protrusive portion 130B of the elastic bump 130 are exposed from the second passivation layer 150, such that the conductive bump (the elastic bump 130 and the conductive layer 140) may be electrically connected to other devices. Moreover, an opening 152 is formed in the second passivation layer 150 to expose the conductive layer 140 over the pad 102, such that the pad 102 and the conductive layer 140 may connect the interconnection layer 10 to other devices. In some embodiments the second passivation layer 150 may be formed from $SiO_2$, such that the structure may have high forming accuracy and fine pitch capability. In some other embodiments, the second passivation layer 150 is formed from polyimide. In yet other embodiments, the opening 152 may be omitted.

In a conventional package structure, a passivation layer with hard material (i.e. $SiO_2$) may be used to increase forming accuracy and fine pitch capability. However, a conventional bump (i.e. a solder bump) formed on the passivation layer may induce high stress in the passivation layer and may cause damage to the structure. The present disclosure uses an elastic bump that can release the stress in the passivation layer. Moreover, a warpage of a conventional package structure may induce an uneven surface of the package structure, and thus the elastic bump of the present disclosure also is used to release a stress between the uneven surface of the package structure and other devices.

Figure 1H:
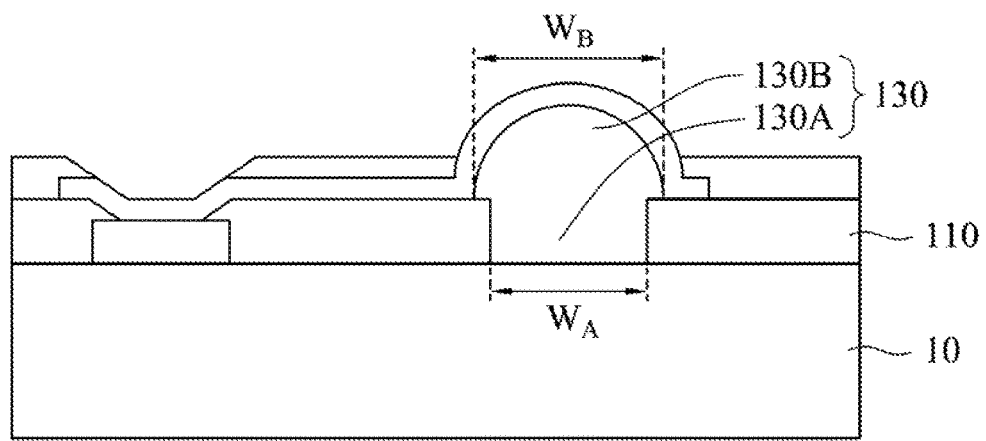
FIG. 1H is a cross-sectional view of a package structure according to some embodiments of the present disclosure.

FIG. 1H is a cross-sectional view of a package structure according to some embodiments of the present disclosure. FIG. 1H is different from FIG. 1G, in that the coupling blocks 104 and the adhesive layer 120 in FIG. 1G are omitted. In this embodiment, the elastic bump 130 is formed such that a portion of the protrusive portion 130B of the elastic bump 130 laterally extends to a top surface of the first passivation layer 110. That is, the width WB of the protrusive portion 130B of the elastic bump 130 is larger than the width WA of the embedded portion 130A of the elastic bump 130. Such configuration may increase the contact area between the elastic bump 130 and the first passivation layer 110 to improve adhesive strength.

It should be noted that the above description only discusses one bump, but the present disclosure is not limited thereto. In some embodiments, the number of the elastic bump may to two or more according to design requirements.

Figure 2A:
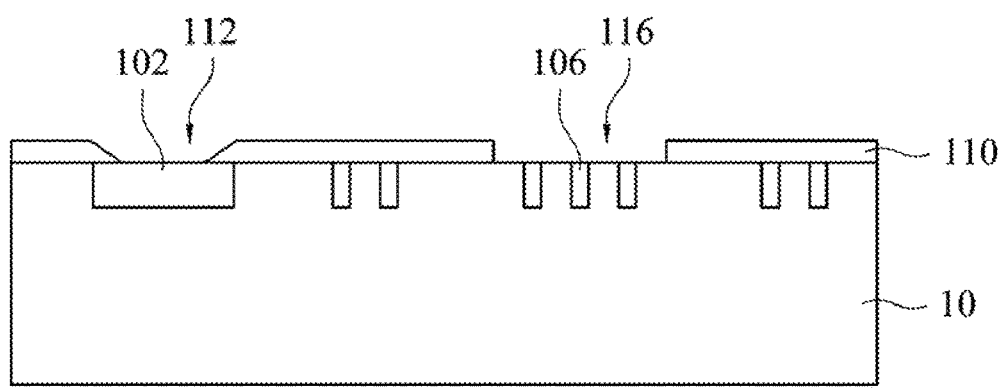
FIGS. 2A to 2E are cross-sectional views illustrating sequential processes for manufacturing a package structure according to some embodiments of the present disclosure.

FIGS. 2A to 2E are sectional views illustrating sequential processes for manufacturing a package structure according to some embodiments of the present disclosure. Some details similar to those described in FIGS. 1A to 1H may be omitted for simplicity. Referring to FIG. 2A, an interconnection layer 10 is formed. The interconnection layer 10 includes a pad 102 and a plurality of metal lines 106 originally formed in the interconnection layer 10. In some embodiments, the pad 102 and the metal lines 106 are made of metal, such as Al or Cu, and may be formed at the same time. In the present embodiment, the interconnection layer 10 is multi-layer structure, and the pad 102 and the metal lines 106 are present at the top-most layer of the interconnection layer 10, such that the pad 102 and the metal lines 106 are exposed from the interconnection layer 10.

Subsequently, a first passivation layer 110 is formed on the interconnection layer 10. In some embodiments, the first passivation layer 110 is made of $SiO_2$. The first passivation layer 110 is patterned to form openings 112 and 116 in the first passivation layer 110, in which the opening 112 expose the pad 102, and the opening 116 expose parts of the metal lines 106 and the surface of the interconnection layer 10. In this embodiment, the first passivation layer 110 may be applied as mask in later processes. The opening 116 defines a position of a bump formed in later step.

Figure 2B:
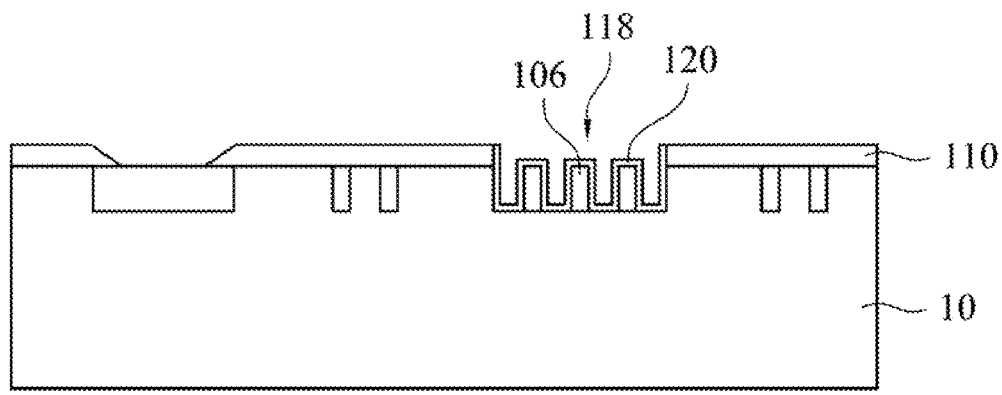

Referring to FIG. 2B the interconnection layer 10 is recessed to form an opening 118. The opening 118 is formed such that the sidewalls of the metal lines 106 are exposed. The opening 118 may be formed by suitable technologies, such as photolithography and etching. The etching process may be controlled such that the opening 118 is formed with a desire depth. That is, the sidewalls of the metal lines 106 may be partially exposed in some embodiments.

The opening 118 defines a position of an elastic bump formed in later steps. However, due to the actual layout design, a region under the elastic bump may not include metal lines. Accordingly, the opening 118 may not include metal lines in some embodiments.

An adhesive layer 120 is formed in the opening 118. In particular, the adhesive layer 120 is conformally formed over the sidewalls of the first passivation layer 110, the exposed metal lines 106, and the exposed surface of the interconnection layer 10. In some embodiments, the adhesive layer 120 may be resin, such as epoxy. In some other embodiments, the adhesive layer 120 may be omitted.

Figure 2C:
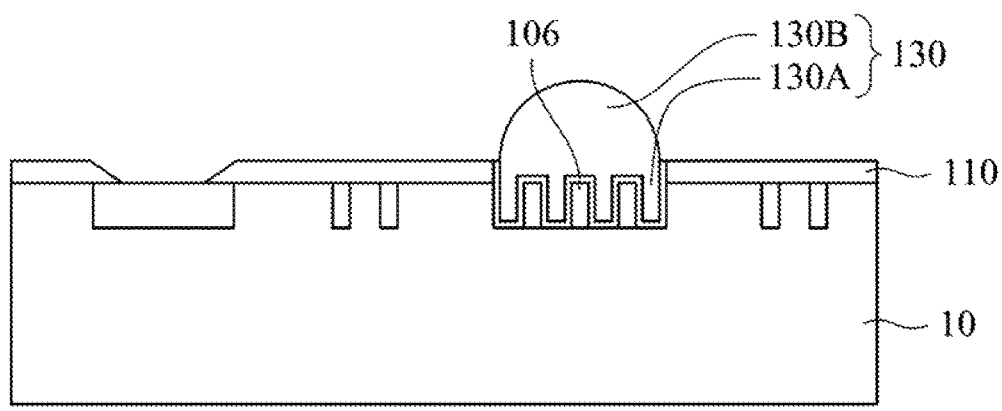

Referring to FIG. 2C, an elastic bump 130 is formed over the interconnection layer 10 and in the opening 118. The elastic bump 130 is made of elastic materials, such as polyimide (PI), polydimethylsiloxane (PDMS), or polyurethane (PU). In detail, the elastic bump 130 includes an embedded portion 130A and a protrusive portion 130B. The protrusive portion 130B is exposed from the first passivation layer 110 and the interconnection layer 10. The embedded portion 130A is embedded in the first passivation layer 110 and the interconnection layer 10, and coupled with metal lines 106. Since the metal lines 106 are engaged into the embedded portion 130A of the elastic bump 130, the contact area between the metal lines 106 and the elastic bump 130 is increased, such that the adhesive strength of the elastic bump 130 may be improved.

Figure 2D:
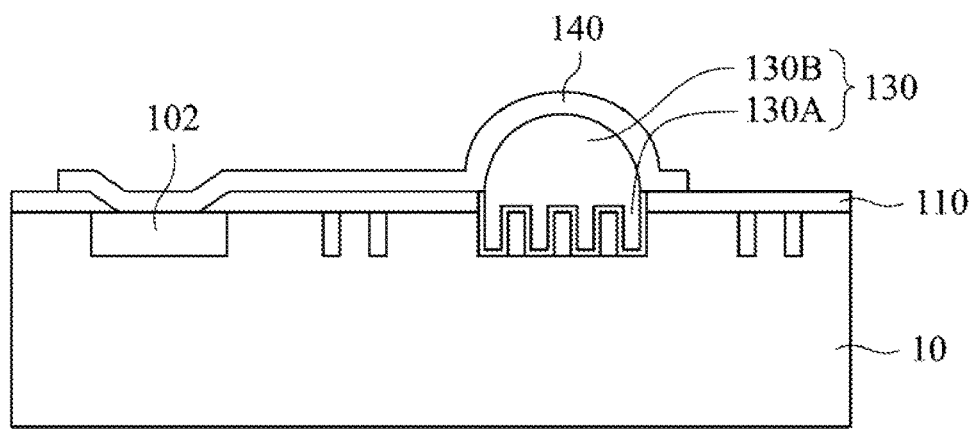

Referring to FIG. 2D, a conductive layer 140 is formed over the first passivation layer 110, the elastic bump 130, and in the opening 112. The conductive layer 140 is directly disposed on the passivation layer 110 and the elastic bump 130, and is in contact with the pad 102. In other words, the conductive layer 140 is electrically connected to the interconnection layer 10 and the underlying structure 5 (as shown in FIG. 1A) through the pad 102. Also, the conductive layer 140 may further be patterned according to design requirements.

In detail, the conductive layer 140 is formed on the surface of the protrusive portion 130B of the elastic bump 130. Thus, the elastic bump 130 and the conductive layer 140 thereon may be collectively referred to a conductive bump, in which the conductive bump electrically connects the interconnection layer 10 to other devices.

Figure 2E:
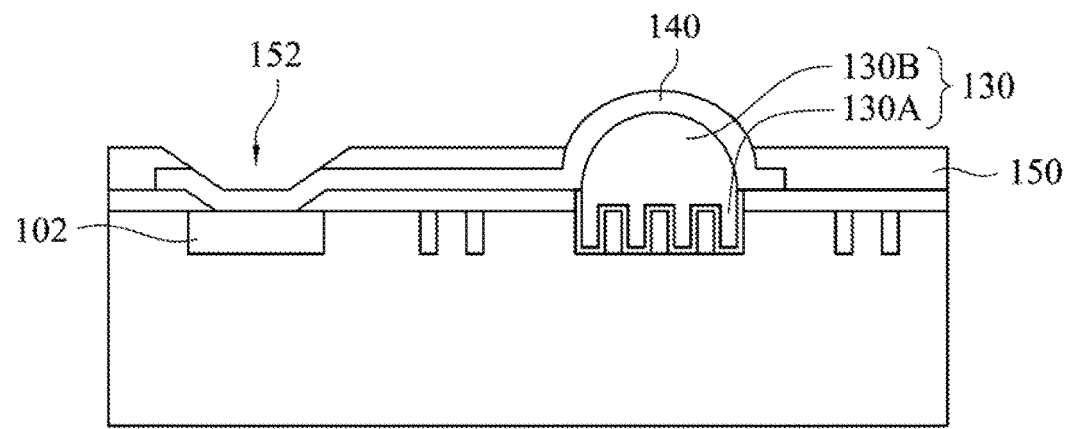

Referring to FIG. 2E, a second passivation layer 150 is formed over the conductive layer 140 and the first passivation layer 110. Next, the second passivation layer 150 is patterned. As a result, the conductive layer 140 formed over the protrusive portion 130B of the elastic bump 130 are exposed from the second passivation layer 150, such that the conductive bump (the elastic bump 130 and the conductive layer 140) may be electrically connected to other devices.

Moreover, an opening 152 is formed in the second passivation layer 150 to expose the conductive layer 140 over the pad 102, such that the pad 102 and the conductive layer 140 may connect the interconnection layer 10 to other device. In some embodiments, the second passivation layer 150 may be $SiO_2$, such that the structure may have high forming accuracy and fine pitch capability. In some other embodiments, the second passivation layer 150 is made of polyimide. In yet other embodiments, the opening 152 may be omitted.

Figure 3A:
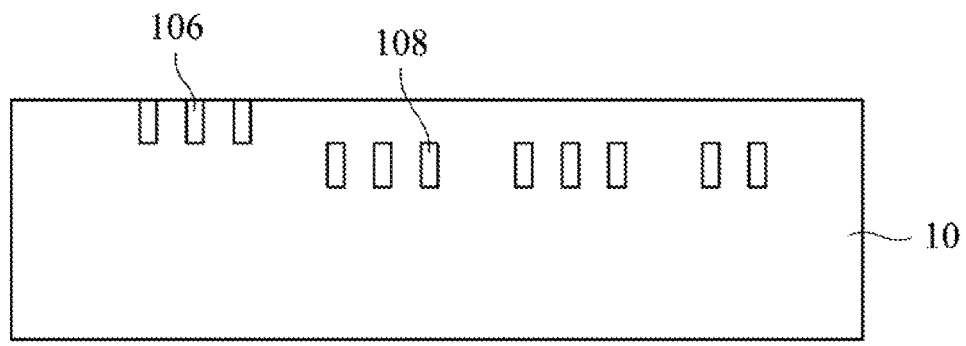
FIGS. 3A to 3E are cross-sectional views illustrating sequential processes for manufacturing a package structure according to some embodiments of the present disclosure.

FIGS. 3A to 3E are sectional views illustrating sequential processes for manufacturing a package structure according to some embodiments of the present disclosure. Referring to FIG. 3A, an interconnection layer 10 is formed. The interconnection layer 10 includes a plurality of metal lines 106 and 108 originally formed in the interconnection layer 10. In the present embodiment, the interconnection layer 10 is multi-layer structure, and the metal lines 106 are present at the top-most layer of the interconnection layer 10, and the metal lines 108 are present at the inter layer of the interconnection layer 10, in which the metal lines 106 may be electrically connected to the metal lines 108 through some interconnection structures, such as vias or metal layers. Accordingly, the metal lines 108 are covered in the interconnection layer 10.

Figure 3B:
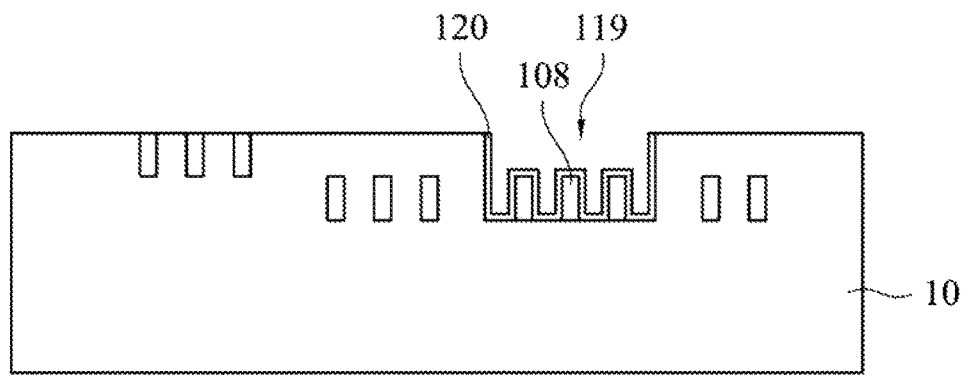

Referring to FIG. 3B, the interconnection layer 10 is recessed to form an opening 119. The opening 119 may be formed by suitable technologies, such as photolithography and etching. The etching process may be controlled such that the opening 119 is formed with a desire depth, such that the metal lines 108 at the inter layer are entirely or partially exposed from the interconnection layer 10 through the opening 119.

The opening 119 defines a position of an elastic bump formed in later steps. However, due to the actual layout design, a region under the elastic bump may not include metal lines. Accordingly, the opening 119 may not include metal lines in some embodiments.

Figure 3C:
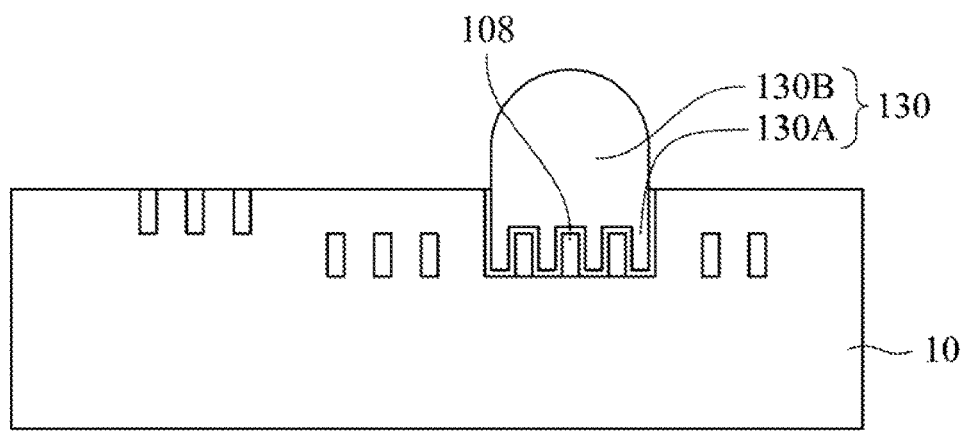

Referring to FIG. 3C, an elastic bump 130 is formed over the interconnection layer 10 and in the opening 119. The elastic bump 130 is made of elastic materials, such as polyimide (PI), polydimethylsiloxane (PDMS), or polyurethane (PU). In detail, the elastic bump 130 includes an embedded portion 130A and a protrusive portion 130B. The protrusive portion 130B is exposed from the interconnection layer 10. The embedded portion 130A is embedded in the interconnection layer 10, and coupled with metal lines 108. Since the metal lines 108 are engaged into the embedded portion 130A of the elastic bump 130, the contact area between the metal lines 106 and the elastic bump 130 is increased, such that the adhesive strength of the elastic bump 130 may be improved.

Figure 3D:
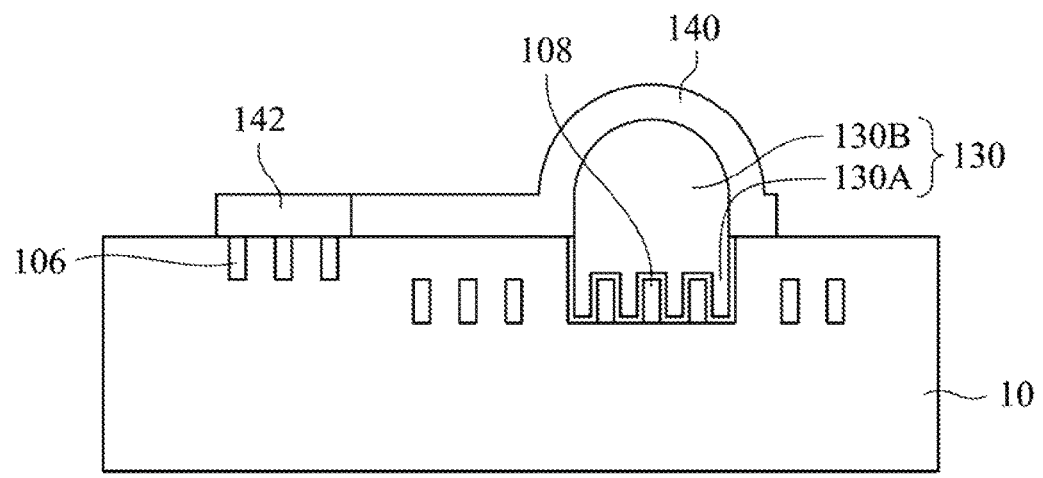

Referring to FIG. 3D, a conductive layer 140 is formed over the interconnection layer 10 and the elastic bump 130. In detail, the conductive layer 140 is directly disposed on the interconnection layer 10 and the elastic bump 130. Also, the conductive layer 140 is in contact with the metal lines 106 of the interconnection layer 10, in which the portion of the conductive layer 140 electrically connected to the metal lines 106 is defined as a pad portion 142. In other words, the conductive layer 140 is electrically connected to the interconnection layer 10 and the underlying structure 5 (as shown in FIG. 1A) through the pad portion 142 of the conductive layer 140. Also, the conductive layer 140 may further be patterned according to design requirements.

In detail, the conductive layer 140 is formed on the surface of the protrusive portion 130B of the elastic bump 130. Thus, the elastic bump 130 and the conductive layer 140 thereon may be collectively referred to a conductive bump, in which the conductive bump electrically connects the interconnection layer 10 to other devices.

Figure 3E:
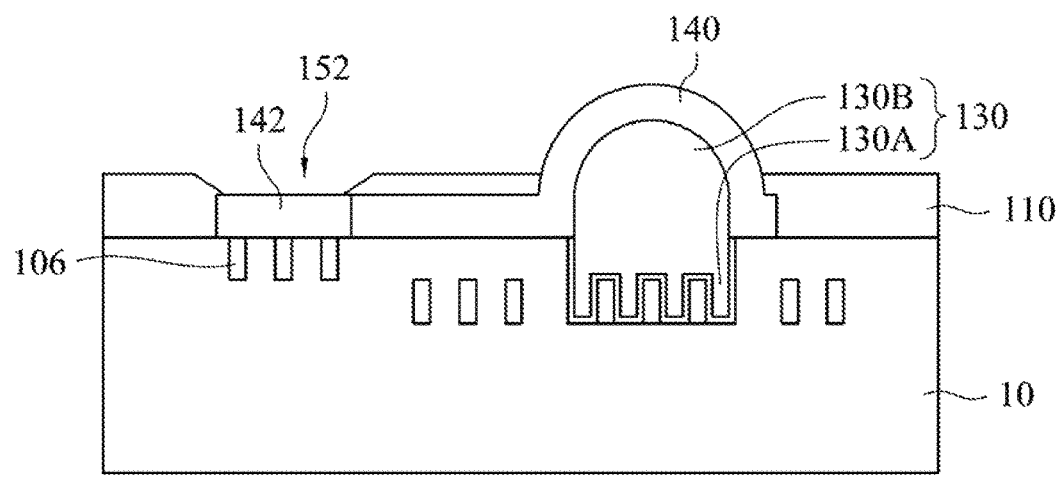

Referring to FIG. 3E, a first passivation 110 is formed over the conductive layer 140 and the interconnection layer 10. Next, the first passivation 110 is patterned. As a result, the conductive layer 140 formed on the protrusive portion 130B of the elastic bump 130 are exposed from the first passivation 110, such that the conductive bump (the elastic bump 130 and the conductive layer 140) may be electrically connected to other device.

Moreover, an opening 152 is formed in the first passivation 110 to expose the conductive layer 140 over the pad portion 142 of the conductive layer 140, such that the pad portion 142 of the conductive layer 140 may connect the interconnection layer 10 to other device. In some embodiments, the first passivation 110 may be $SiO_2$, such that the structure may have high forming accuracy and fine pitch capability. In some other embodiments, the first passivation 110 is made of polyimide. In yet other embodiments, the opening 152 may be omitted.

Figure 4A:
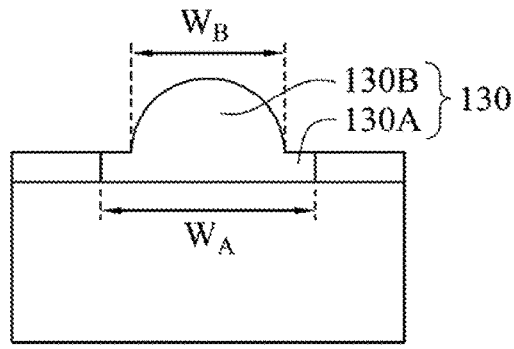
FIGS. 4A to 4D are cross-sectional views of a package structures according to some embodiments of the present disclosure.

FIGS. 4A to 4D are sectional views of a package structures according to some embodiments of the present disclosure. As shown in FIG. 4A, an elastic bump 130 includes a protrusive portion 130B having a hemispherical top surface and an embedded portion 130A. The protrusive portion 130B has a width WB, and the embedded portion 130A has a width WA, in which the width WA is greater than the width WB. The greater width of the embedded portion 130A may increase the contact area onto the elastic bump 130.

Figure 4B:
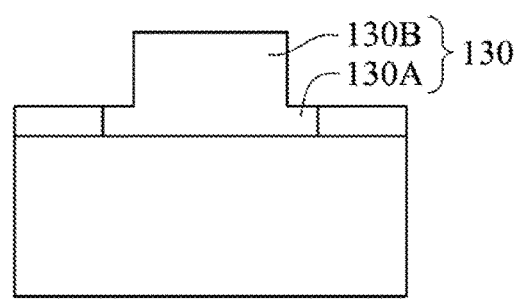

Reference is made to FIG. 4B. FIG. 4B is different from FIG. 4A, in that a protrusive portion 130B of an elastic bump 130 has a planar top surface.

Figure 4C:
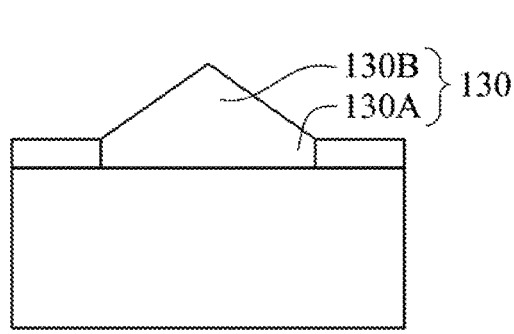

Reference is made to FIG. 4C. FIG. 4C is different from FIG. 4A, in that a protrusive portion 130B of an elastic bump 130 has a triangular cross section.

Figure 4D:
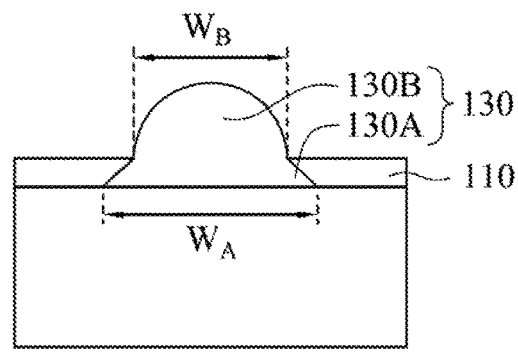

Reference is made to FIG. 4D. An elastic bump 130 includes a protrusive portion 130B having hemispherical top surface and an embedded portion 130A. The embedded portion 130A has a gradually-changed width, in which the width of the embedded portion 130A increases from WB to WA from the bottom to the top of the embedded portion 130A. Such design may improve the adhesive strength between the elastic bump 130 and the passivation layer 110, because the elastic bump 130 with a greater bottom width would be harder to be peeled off from the passivation layer 110.

In FIG. 4D, the profile of the elastic bump 130 can be tuned by varying patterning conditions of the passivation layer 110. That is, the patterning (or etching) setting affects the profile of the passivation layer 110. Therefore, by varying the patterning conditions, such as etching time, etchant type, etc., the profile of the elastic bump 130 can be tuned accordingly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A package structure, comprising:
   an interconnection layer;
   a pad disposed in the interconnection layer;
   a first passivation layer disposed on the interconnection layer, wherein the first passivation layer has at least one first opening and a second opening, the second opening exposes the pad;
   at least one elastic bump disposed on the interconnection layer, wherein a portion of the elastic bump is embedded in the first opening, and the portion of the elastic bump extends below the first passivation layer; and
   a conductive layer disposed on the elastic bump and the first passivation layer, wherein the conductive layer is in contact with the pad through the second opening, the elastic bump is between the first passivation layer and the conductive layer, and the conductive layer covers a top surface of the elastic bump.

2. The package structure of claim 1, further comprising:
   a pad disposed in the first passivation layer, wherein the conductive layer is in contact with the pad.

3. The package structure of claim 1, wherein the elastic bump is formed from polyimide, polydimethylsiloxane, or polyurethane.

4. The package structure of claim 1, wherein the first passivation layer is formed from $SiO_2$.

5. The package structure of claim 1, further comprising:
   at least one coupling block disposed in the first opening, wherein the coupling block is engaged into the elastic bump.

6. The package structure of claim 5, wherein the coupling block is formed from metal or dielectric.

7. The package structure of claim 1, further comprising:
   an adhesive layer formed in the first opening.

8. The package structure of claim 1, wherein the first opening further extends to the interconnection layer.

9. The package structure of claim 8, further comprising:
   at least one metal line exposed from the first opening, wherein the metal line is engaged into the elastic bump.

10. The package structure of claim 9, further comprising:
    an adhesive layer formed in the first opening.

11. The package structure of claim 1, further comprising a second passivation layer, wherein the conductive layer is between the first passivation layer and the second passivation layer.

* * * * *